(12) United States Patent
Otsuka

(10) Patent No.: US 8,001,507 B2
(45) Date of Patent: Aug. 16, 2011

(54) ELECTRIC CIRCUIT AND METHOD FOR ADJUSTING WIRELENGTH OF CLOCK SIGNAL IN ELECTRIC CIRCUIT

(75) Inventor: Shigeki Otsuka, Osaka (JP)

(73) Assignee: Funai Electric Co., Ltd., Osaka (JP)

(*) Notice: Subject to any disclaimer, the term of this patent is extended or adjusted under 35 U.S.C. 154(b) by 423 days.

(21) Appl. No.: 12/285,775

(22) Filed: Oct. 14, 2008

(65) Prior Publication Data
US 2009/0108893 A1  Apr. 30, 2009

(30) Foreign Application Priority Data
Oct. 25, 2007  (JP) ................. 2007-277209

(51) Int. Cl.
*G06F 17/50* (2006.01)
*G06F 9/455* (2006.01)

(52) U.S. Cl. ........ 716/113; 716/100; 716/101; 716/106; 716/107; 716/108; 716/110; 716/111; 716/112; 716/114

(58) Field of Classification Search .......... 716/100–101, 716/106–108, 110–114
See application file for complete search history.

(56) References Cited

U.S. PATENT DOCUMENTS

| | | | | |
|---|---|---|---|---|
| 5,784,600 A | * | 7/1998 | Doreswamy et al. | 713/503 |
| 6,088,253 A | * | 7/2000 | Shimizu | 365/51 |
| 6,223,328 B1 | * | 4/2001 | Ito et al. | 716/113 |
| 6,305,001 B1 | * | 10/2001 | Graef | 716/105 |
| 6,393,575 B1 | * | 5/2002 | Kang et al. | 713/400 |
| 7,831,945 B2 | * | 11/2010 | Barnes | 716/113 |

FOREIGN PATENT DOCUMENTS

| | | |
|---|---|---|
| JP | 05-088776 | 4/1993 |
| JP | 2000-122751 | 4/2000 |
| JP | 2000-148282 | 5/2000 |
| JP | 2000-267756 | 9/2000 |
| JP | 2001-177046 | 6/2001 |
| JP | 2004-110103 | 4/2004 |
| JP | 2006-054348 | 2/2006 |
| JP | 2006-179112 | 7/2006 |

* cited by examiner

*Primary Examiner* — Nghia Doan
(74) *Attorney, Agent, or Firm* — Morgan, Lewis & Bockius LLP

(57) ABSTRACT

A designing method is provided for designing an electric circuit including a clock output circuit for delivering a clock signal and a plurality of processing circuits for receiving the clock signal from the clock output circuit via wirings for clock transmission so as to perform a predetermined process based on the clock signal. The method includes, as a method for designing the wirings for clock transmission to have a predetermined length, a first step of connecting wirings between each of the processing circuits and an arbitrary point (as a "first point") so that the wirings have substantially the same length (as a "first length"), and a second step of connecting the first point to the clock output circuit by a single wire having the length that is obtained by subtracting the first length from the predetermined length. Thus, lengths of the wirings for transmitting the clock signal to the plurality of circuits are adjustable while the entire length of the wirings is minimized.

4 Claims, 2 Drawing Sheets

US 8,001,507 B2

ELECTRIC CIRCUIT AND METHOD FOR ADJUSTING WIRELENGTH OF CLOCK SIGNAL IN ELECTRIC CIRCUIT

CROSS-REFERENCE TO RELATED APPLICATIONS

This application is based on Japanese Patent Application No. 2007-277209 filed on Oct. 25, 2007, and the contents of which are hereby incorporated by reference.

BACKGROUND OF THE INVENTION

1. Field of the Invention

The present invention relates to an electric circuit associated with transmission of a clock signal and a method for designing the electric circuit.

2. Description of Related Art

Conventionally, electronic equipment including a personal computer or the like uses a memory device of a standard such as Double Data Rate 2 (DDR2) SDRAM, for instance. A plurality of such memory devices may be disposed in electronic equipment for a purpose of securing sufficient memory capacity or other purposes. A schematic structure of an example of the electric circuit having such the structure is shown in FIG. 2.

The electric circuit includes a control IC 101 and a plurality of (e.g., four) SDRAMs 102a to 102d, which are connected to each other via wirings 103 and 104. In addition, the control IC 101 is provided with a clock signal output portion 111 for outputting a predetermined clock signal and a data input and output portion 112 for supplying or receiving various data to or from the SDRAMs 102a to 102d.

Such the electric circuit enables the SDRAMs 102a to 102d to read or write data in synchronization with a clock signal (external clock) that is sent from the clock signal output portion 111 via the wiring 103. Note that the clock signal is delivered from the clock signal output portion 111 and is imparted to the SDRAMs 102a to 102d after branching at a branch node 103b.

In addition, the data input and output portion 112 is supplied with the clock signal from the clock signal output portion 111 and performs input and output of data from or to the SDRAMs 102a to 102d via the wiring 104 in synchronization with the clock signal.

Noting an operation of writing data in the SDRAMs 102a to 102d, for instance, it is desirable that the writing operation should be performed in the SDRAMs 102a to 102d at timings delayed as little as possible from the timing when the data to be written reaches the SDRAMs 102a to 102d via the wirings 104.

However, even if a clock signal that is common to individual operations is used, there may be the case where a time difference occurs between the time period from reception of the clock signal by the data input and output portion 112 until arrival of the data at the SDRAMs 102a to 102d via the wiring 104 and the time period until reception of the clock signal by the SDRAMs 102a to 102d via the wiring 103, due to a delay time of transmission.

Therefore, when such the electric circuit is designed, a wiring length adjustment portion 103a is disposed at each branch of the individual wirings 103 as shown in FIG. 2. This wiring length adjustment portion 103a is disposed for adjusting the length of the wiring 103 so as to adjust transmission delay time of the clock signal (the longer the wiring, the longer the delay time is). According to the wiring length adjustment portion 103a shown in FIG. 2, a meandering pattern is adopted so that the wiring 103 is adjusted to be longer intentionally and that the transmission delay times of the clock signal to the SDRAMs 102a to 102d are increased.

Thus, it is possible to minimize the time difference by adjusting the wiring lengths as described above, so that the operation of writing data in the SDRAMs 102a to 102d can be performed more appropriately. Note that the documents below disclose conventional techniques in the art of the present invention.

JP-A-2004-110103
JP-A-2000-267756
JP-A-2006-54348
JP-A-2000-122751
JP-A-2000-148282

However, if it is necessary to increase the length of the wiring length adjustment portion 103a in the case where the wiring length adjustment portion 103a is disposed at each branch as described above, it is necessary to increase all the plurality of wiring lengths 103a of the individual branches. Therefore, the entire length of the wiring 103 becomes very long, so that power loss will increase due to an increase in wiring resistance. As a result, quantity of current of the clock signal to be supplied to the SDRAMs 102a to 102d may be insufficient.

If the quantity of current of the clock signal is insufficient, it causes drop of an amplitude level of the clock signal or deterioration of a waveform of the clock signal, so that the clock signal cannot be transmitted accurately. Therefore, a malfunction may occur in writing or the like of the data in the SDRAMs 102a to 102d.

SUMMARY OF THE INVENTION

An object of the present invention is to provide an electric circuit and a method for designing the electric circuit that enable to adjust lengths of wirings for transmitting a clock signal to a plurality of processing circuits (e.g., SDRAMs) and still enable to shorten a total length of the wirings.

A designing method of an electric circuit according to the present invention includes a clock output circuit for delivering a clock signal and a plurality of processing circuits for receiving the clock signal from the clock output circuit via wirings for clock transmission so as to perform a predetermined process based on the clock signal. The method includes, as a method for designing the wirings for clock transmission to have a predetermined length, a first step of connecting wirings between each of the processing circuits and an arbitrary point (as a "first point") so that the wirings have substantially the same length (as a "first length"), and a second step of connecting the first point to the clock output circuit by a single wire having the length that is obtained by subtracting the first length from the predetermined length.

According to this method, the length of the wirings for clock transmission can be set to be a predetermined length. Therefore, a delay time in transmission of the clock signal can be adapted to be a predetermined time. In addition, this setting can be realized by connecting the first point to the clock output circuit by a single wire having the remaining length. As a result, even if a relatively long wiring is required to realize this setting, it is sufficient to increase the length of the single wire. Therefore, it is possible to shorten the entire length of the wirings for transmitting the clock compared with the case where the individual wirings after the branch are required to have increased lengths.

Further in the above-mentioned designing method, the predetermined length may be the length such that a delay time of the clock signal due to transmission from the clock output circuit to the processing circuit via the wirings for clock transmission becomes a predetermined time. This method enables adjustment of a delay time of the clock signal in the processing circuit to be a predetermined time.

Further in the above-mentioned designing method, the electric circuit also includes a data output circuit for receiving the clock signal from the clock signal output circuit so as to transmit data to the processing circuit in synchronization with the clock signal, the processing circuit is a memory circuit for writing the transmitted data in synchronization with the clock signal, and the predetermined time is substantially the same as the time from output of the clock signal by the clock signal output circuit to arrival of the data at the processing circuit.

According to this method, the clock signal and the data can be transmitted to the processing circuit (memory circuit) substantially at the same time. Therefore, a process of writing data in the memory circuit can be performed appropriately.

Further in the above-mentioned designing method, the wirings for clock transmission may include a branch node disposed between the first point and the processing circuit, and the processing circuit may be disposed at each branch after the branch node.

According to this structure, wiring lengths after the branch node can be further shortened in the case where the processing circuits are disposed closely or in other cases.

In addition, more specifically as the above-mentioned designing method, the single wire may be disposed in a meandering manner, and each of the processing circuits may be a DDR2 SDRAM. Furthermore, an electric circuit designed by the above-mentioned designing method and an electrical apparatus equipped with the electric circuit are also useful.

In addition, an electric circuit according to the present invention includes a clock output circuit for delivering a clock signal and a plurality of processing circuits for receiving the clock signal from the clock output circuit via wirings for clock transmission so as to perform a predetermined process based on the clock signal. The wirings for clock transmission is connected by a single wire between the clock output circuit and a certain point (as a "first point") on the electric circuit, and is further connected between the first point and the individual processing circuits by a plurality of wirings branching from the first point so that the wirings have substantially the same length, and the length of the single wire is adjusted so that a delay time of the clock signal due to transmission from the clock output circuit to the processing circuit via the wirings for clock transmission becomes a predetermined time.

According to this structure, a delay time of the clock signal in the processing circuit can be adapted to be a predetermined time. In addition, since the length of the single wire is adjusted, it is possible to shorten the entire length of the wirings (or decrease power loss) compared with the structure in which lengths of individual wirings after the branch node (after the first point) are adjusted, so that it is easy to avoid insufficient quantity of current of the clock signal.

BRIEF DESCRIPTION OF THE DRAWINGS

The above-mentioned and other objects and features of the present invention will be apparent from the following description about a preferred embodiment with reference to the attached drawings as below.

DETAILED DESCRIPTION OF THE PREFERRED EMBODIMENTS

Figure 1:
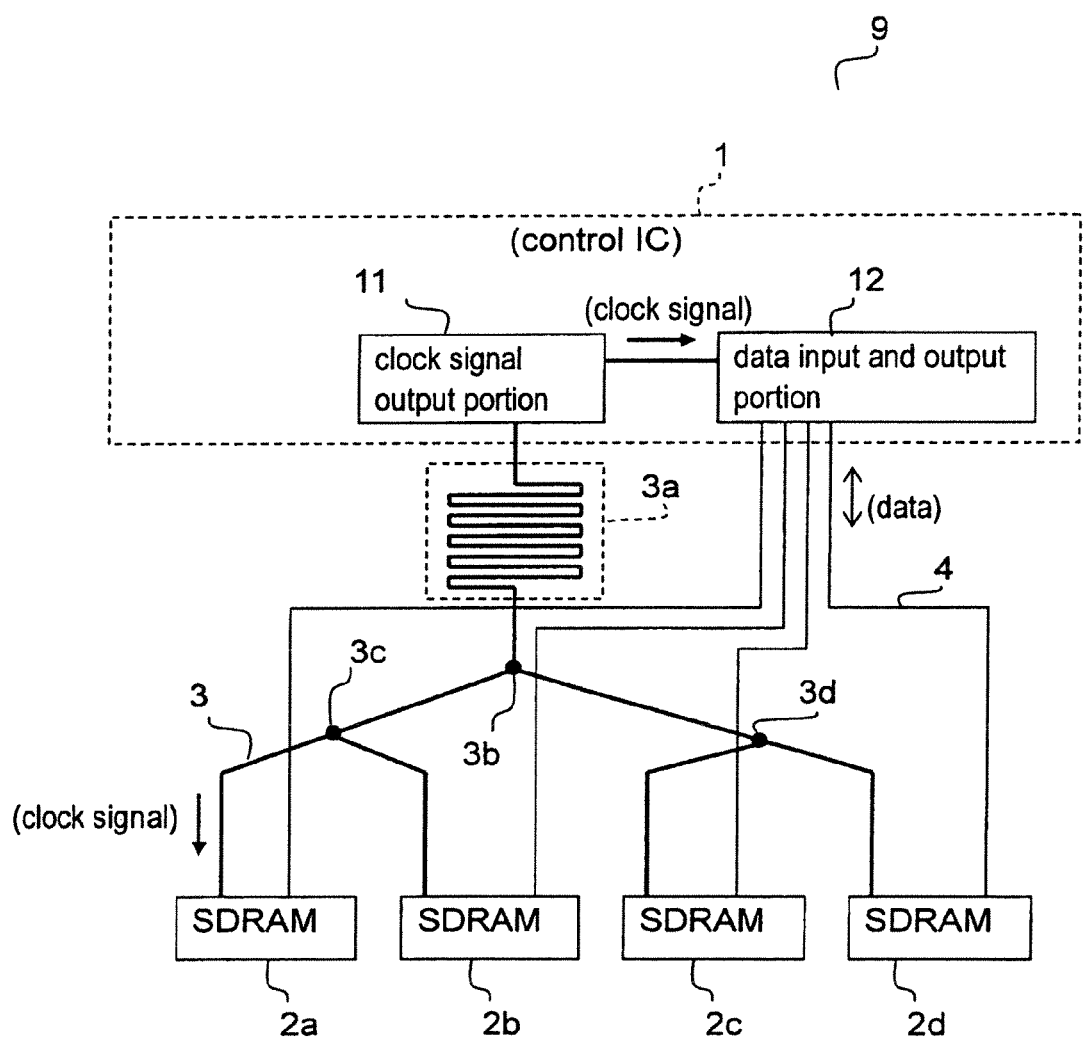
FIG. 1 is a structural diagram of an electric circuit according to an embodiment of the present invention.

Now, an embodiment of the present invention will be described concerning an electric circuit having a structure shown in FIG. 1. As shown in this diagram, an electric circuit 9 includes a control IC 1 and four SDRAMs (Synchronous DRAMs) 2a to 2d). In addition, the control IC includes a clock signal output portion 11 and a data input and output portion 12.

The clock signal output portion 11 generates a clock signal having a predetermined frequency, which is transmitted to the data input and output portion 12, the individual SDRAMs 2a to 2d, and the like. Note that the transmission of the clock signal to the individual SDRAMs 2a to 2d is performed via the wiring 3 that connects them with each other.

The data input and output portion 12 performs input and output of various data with respect to the SDRAMs 2a to 2d. The input and output of data is performed via the wirings 4 that connect them with each other. In addition, this input and output operation is performed in synchronization with the clock signal supplied from the clock signal output portion 11.

The SDRAMs 2a to 2d to be used are ones of Double Data Rate 2 (DDR2) SDRAM standard, for instance, in which various data are read or written in synchronization with an external clock (here, a clock signal transmitted from the clock signal output portion 11).

According to the electric circuit having the structure described above, the data is written in the SDRAMs 2a to 2d in synchronization with the clock signal when the data input and output portion 12 delivers data to the SDRAMs 2a to 2d. Thus, the SDRAMs 2a to 2d can store the data.

Here, noting the layout state of the wiring 3, it is a single line from the clock signal output portion 11 to a first branch node 3b. In addition, after the branch node 3b it branches into lines including a line directed to the SDRAMs 2a and 2b and a line directed to the SDRAMs 2c and 2d.

Furthermore, it branches into a line directed to the SDRAM 2a and a line directed to the SDRAM 2b at a branch node 3c. In the same manner it branches into a line directed to the SDRAM 2c and a line directed to the SDRAM 2d at a branch node 3d. In other words, it can be regarded that each of the SDRAMs 2a to 2d is connected to the clock signal output portion 11 in a so-called tree structure (or in a two-branch tournament structure).

In addition, the wiring from the branch node 3b to the SDRAM 2a via the branch node 3c, the wiring from the branch node 3b to the SDRAM 2b via the branch node 3c, the wiring from the branch node 3b to the SDRAM 2c via the branch node 3d, and the wiring from the branch node 3b to the SDRAM 2d via the branch node 3d are designed to have substantially the same length. In other words, wirings from the first branch node 3b to the individual SDRAMs 2a to 2d have substantially the same length. Furthermore, the single wiring from the clock signal output portion 11 to the branch node 3b, i.e., the wiring upstream the branch node 3b has a wiring length adjustment portion 3a.

This wiring length adjustment portion 3a is a portion whose wiring length is adjusted arbitrarily in a designing stage of the circuit, and it has a meandering pattern as shown in FIG. 1, for instance. This pattern facilitates to adjust the length of the single line wiring by changing a width and/or intervals of the meandering pattern without changing a position of the clock signal output portion 11 and the branch node 3b.

The wiring length adjustment portion 3a is not limited to the form described above but can have various forms. Thus, in the designing stage of the circuit, delay times of the clock signal to be transmitted to the individual SDRAMs 2a to 2d can be adjusted easily via a length of the wiring 3. Note that a delay time of a signal to be transmitted through a wiring is longer as the wiring is longer as understood well.

This adjustment of the wiring length by the wiring length adjustment portion 3a enables to set the time necessary for the data corresponding to the clock to reach the SDRAMs 2a to 2d via the wiring 4 after the clock output by the clock signal output portion 11 to be substantially the same as the time for the clock to reach the SDRAMs 2a to 2d via the wiring 3. In other words, the wiring length in the wiring length adjustment portion 3a is adjusted so that the time necessary for the data to reach the SDRAMs 2a to 2d with respect to the clock output timing by the clock signal output portion 11 becomes the same as the time necessary for the clock signal to reach.

Since the arrangement and the form of the wiring 3 are set as described above, the electric circuit 9 can perform the process for writing data into the SDRAMs 2a to 2d in synchronization with the clock signal appropriately.

Next, a method for designing the above-mentioned electric circuit 9 will be described. Here, an arrangement of the control IC 1, the individual SDRAMs 2a to 2d and the wiring 4 for transmitting data is determined in advance.

First, the individual SDRAMs 2a to 2d and the point to be a first branch node (hereinafter referred to as a "first point") in the electric circuit 9 (corresponding to the branch node 3b) are connected to each other via the wiring. In this case, the wiring lengths from the first point to the individual SDRAMs 2a to 2d are adapted to be substantially the same. In addition, although the position of the first point can be arbitrary, it is preferable to be a position that enables the wiring length from the first point to the individual SDRAMs 2a to 2d to be as short as possible.

In addition, when they are connected actually, branch nodes (3c and 3d) as shown in FIG. 1 may be disposed appropriately, so that SDRAMs 2a to 2d can be arranged at the branches, respectively. Thus, it is possible to shorten the entire length (total sum of the lengths) of the wirings used for connecting the first point and the SDRAMs 2a to 2d in the case where the SDRAMs 2a to 2d are arranged to be close to each other.

After that, the clock signal output portion 11 and the first point are connected to each other by the single wire. In this case, the length of the single wire is adapted so that a length of the wiring 3 becomes a predetermined target length. In other words, the wiring length adjustment portion 3a shown in FIG. 1 is disposed in the single wire. More specifically, the time from the clock signal output by the clock signal output portion 11 to the arrival of the data at the SDRAMs 2a to 2d is adapted to be substantially the same as the time necessary for the clock signal to reach in the same manner.

Note that the target length is grasped in advance by determining the time (T1) from the clock signal output by the clock signal output portion 11 to the arrival of the data at the SDRAMs 2a to 2d and by calculating the wiring length in the case where the transmission delay time of the clock signal becomes the time T1, for instance. In other words, a result of this calculation is regarded as the target length. Note that the time T1 becomes a total sum of the delay time of the clock signal in the transmission from the clock signal output portion 11 to the data input and output portion 12, the time necessary for the data input and output portion 12 to deliver data to the SDRAMs 2a to 2d after receiving the clock signal, the delay time of the data in transmission from the data input and output portion 12 to the SDRAMs 2a to 2d, and delay times due to other factors.

In addition, the wiring length of the wiring length adjustment portion 3a is adjusted in advance so that the length of the single wire connecting the clock signal output portion 11 with the first point becomes the length that is obtained by subtracting the length of the wiring connecting the first point with the SDRAMs 2a to 2d from the above-mentioned target length (remaining length).

The above-mentioned adjustment of the wiring length in the wiring length adjustment portion 3a can also be regarded as adjustment of the delay time of the clock signal due to transmission from the clock signal output portion 11 to the SDRAMs 2a to 2d to be a predetermined time.

Figure 2:
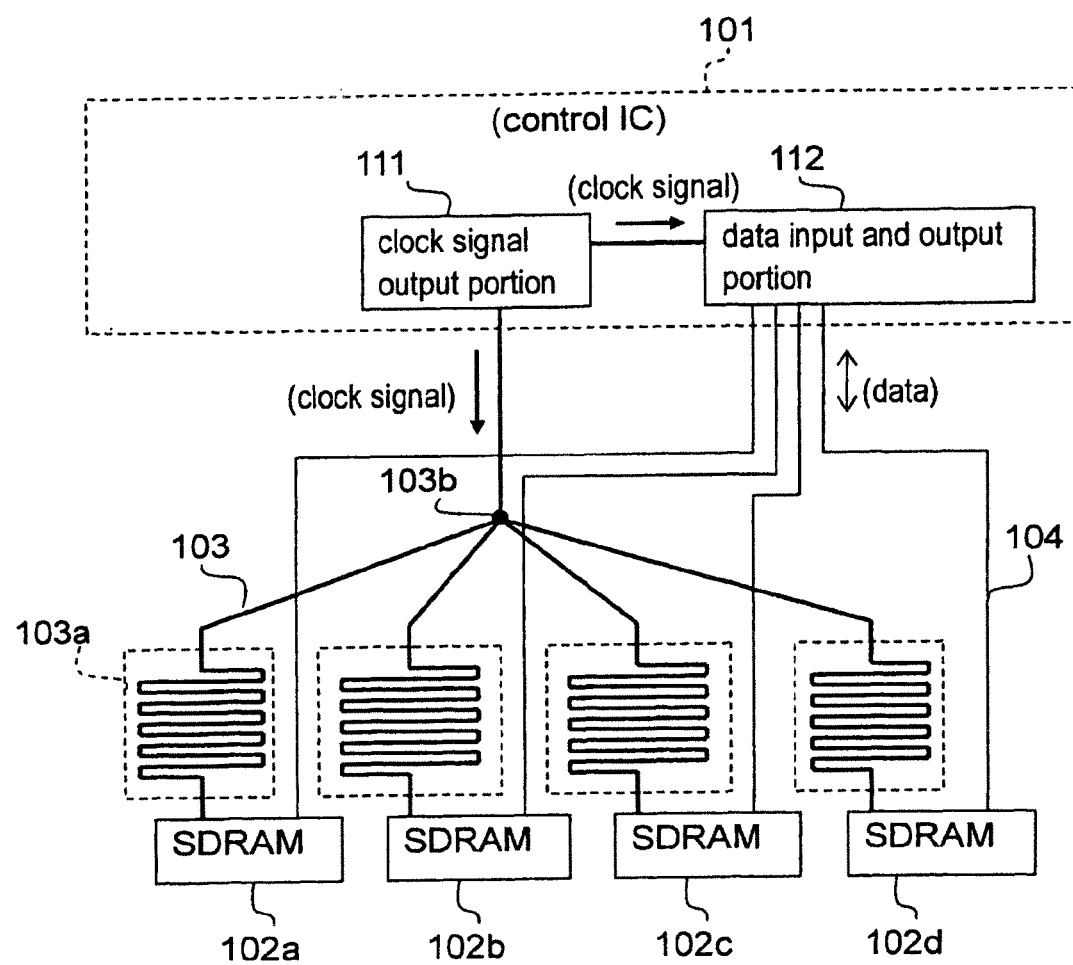
FIG. 2 is a structural diagram according to an example of a conventional electric circuit.

The above-mentioned method of designing the electric circuit enables to realize the electric circuit 9 shown in FIG. 1. Although wiring extensions for four lines are necessary when the wiring extension is performed by the wiring length adjustment portion 103a in the conventional electric circuit shown in FIG. 2, the equivalent wiring extension in the electric circuit 9 of this embodiment only requires the wiring extension for one line. Therefore, it can shorten the entire length of the wiring 3 comparing with the conventional electric circuit. In addition, a space necessary for the wiring can be minimized so that a small circuit can be realized.

Although an example of the embodiment of the present invention is described above, the embodiment of the present invention is not limited to this example but can be modified variously without deviating from the scope of the present invention. In addition, although the SDRAMs are exemplified as devices that receive the clock signal in this embodiment, they can be other devices that perform processes based on the clock signal. In addition, the electric circuit of this embodiment can be applied widely to an electrical apparatus such as a personal computer.

Note that the length of the wiring for transmitting the clock can be adopted to be a predetermined length according to the method of designing the electric circuit according to the present invention. Therefore, it is possible to set the delay time in transmission of the clock signal to be a predetermined time. In addition, this setting can be realized by connecting the first point to the clock output circuit by the single wire having the remaining length. As a result, even if a relatively long wiring is required to realize this setting, it is sufficient to increase the length of the single wire. Therefore, it is possible to shorten the entire length of the wirings for transmitting the clock compared with the case where the individual wirings after the branch are required to have increased lengths.

What is claimed is:
1. An electric circuit comprising:
a clock output circuit for delivering a clock signal;
a plurality of processing circuits for receiving the clock signal from the clock output circuit via wirings for clock transmission so as to perform a predetermined process based on the clock signal; and
a data output circuit for receiving the clock signal from the clock output circuit and transmitting, in synchronization with the clock signal, data to the processing circuits via wirings different from the wirings of the clock transmission, wherein
the processing circuits are DDR2 SDRAMs to which the data transmitted from the data output circuit is written in synchronization with the clock signal,
the wirings for clock transmission is connected by a single wire between the clock output circuit and a certain point referred as a first point on the electric circuit, and is further connected between the first point and the indi- vidual processing circuits by a plurality of wirings branching from the first point so that the wirings have the same length, the single wire includes a wiring length adjustment portion which has a meandering pattern and which is used for adjustment of length of the wirings for clock transmission, and the adjustment of the length of the wirings for clock transmission by use of the wiring length adjustment portion is so performed as to make substantially equal time periods, both from output of the clock signal by the clock signal output circuit, to arrival of the data corresponding to the clock signal at the processing circuits and to arrival of the clock signal to the processing circuits via the wirings for clock transmission.

2. The electric circuit according to claim 1, wherein the adjustment of the length of the wirings for clock transmission by use of the wiring length adjustment portion is achieved by changing a width of the meandering pattern of the wiring length adjustment portion.

3. The electric circuit according to claim 1, wherein the adjustment of the length of the wirings for clock transmission by use of the wiring length adjustment portion is achieved by changing intervals of the meandering pattern of the wiring length adjustment portion.

4. An electrical apparatus comprising an electric circuit, the electric circuit electric circuit comprising:

a clock output circuit for delivering a clock signal;

a plurality of processing circuits for receiving the clock signal from the clock output circuit via wirings for clock transmission so as to perform a predetermined process based on the clock signal; and a data output circuit for receiving the clock signal from the clock output circuit and transmitting, in synchronization with the clock signal, data to the processing circuits via wirings different from the wirings of the clock transmission, wherein the processing circuits are DDR2 SDRAMs to which the data transmitted from the data output circuit is written in synchronization with the clock signal, the wirings for clock transmission is connected by a single wire between the clock output circuit and a certain point (referred as a first point) on the electric circuit, and is further connected between the first point and the individual processing circuits by a plurality of wirings branching from the first point so that the wirings have substantially the same length, the single wire includes a wiring length adjustment portion which has a meandering pattern and which is used for adjustment of length of the wirings for clock transmission, and the adjustment of the length of the wirings for clock transmission by use of the wiring length adjustment portion is so performed as to make substantially equal time periods, both from output of the clock signal by the clock signal output circuit, to arrival of the data corresponding to the clock signal at the processing circuits and to arrival of the clock signal to the processing circuits via the wirings for clock transmission.

* * * * *